(12) United States Patent
Parhi et al.

(10) Patent No.: US 7,308,640 B2
(45) Date of Patent: Dec. 11, 2007

(54) LOW-LATENCY ARCHITECTURES FOR HIGH-THROUGHPUT VITERBI DECODERS

(75) Inventors: Keshab K. Parhi, Maple Grove, MN (US); Junjin Kong, Roseville, MN (US)

(73) Assignee: Leanics Corporation, Maple Grove, MN (US)

( * ) Notice: Subject to any disclaimer, the term of this patent is extended or adjusted under 35 U.S.C. 154(b) by 446 days.

(21) Appl. No.: 10/922,205

(22) Filed: Aug. 19, 2004

(65) Prior Publication Data

US 2005/0060633 A1   Mar. 17, 2005

Related U.S. Application Data

(60) Provisional application No. 60/496,307, filed on Aug. 19, 2003.

(51) Int. Cl.
    *H03M 13/03* (2006.01)
(52) U.S. Cl. ............... 714/795; 714/794; 375/341; 375/262; 702/9; 369/59.22
(58) Field of Classification Search ............... 714/795, 714/766, 772, 703, 201, 753, 6
See application file for complete search history.

(56) References Cited

U.S. PATENT DOCUMENTS

| | | | | |
|---|---|---|---|---|
| 5,042,036 A | * | 8/1991 | Fettweis | 714/795 |
| 5,530,707 A | * | 6/1996 | Lin | 714/792 |
| 5,935,270 A | * | 8/1999 | Lin | 714/795 |
| 6,343,105 B1 | * | 1/2002 | Saegusa | 375/341 |
| 6,539,367 B1 | * | 3/2003 | Blanksby et al. | 706/14 |
| 2004/0243908 A1 | * | 12/2004 | Box et al. | 714/759 |

* cited by examiner

*Primary Examiner*—Guy Lamarre
*Assistant Examiner*—Fritz Alphonse

(57) ABSTRACT

Digital circuits and methods for designing digital circuits are presented. More particularly, the present invention relates to error correction circuits and methods in communications and other systems. In the present invention, a novel K-nested layered look-ahead method and its corresponding architecture, which combine K-trellis steps into one trellis step (where K is the encoder constraint length), are proposed for implementing low-latency high-throughput rate Viterbi decoder circuits. The main idea of the present invention involves combining K-trellis steps as a pipeline structure and then combining the resulting look-ahead branch metrics as a tree structure in a layered manner to decrease the ACS precomputation latency of look-ahead Viterbi decoder circuits. The proposed method guarantees parallel paths between any two trellis states in the look-ahead trellises and distributes the add-compare-select (ACS) computations to all trellis layers. It leads to regular and simple architecture for the Viterbi decoding algorithm. The look-ahead ACS computation latency of the proposed method increases logarithmically with respect to the look-ahead step (M) divided by the encoder constraint length (K) as opposed to linearly as in prior work. The main advantage of this invention is that it has the least latency among all known look-ahead Viterbi decoder circuits for a given level of parallelism.

18 Claims, 11 Drawing Sheets

FIG. 1 "PRIOR ART"

LOW-LATENCY ARCHITECTURES FOR HIGH-THROUGHPUT VITERBI DECODERS

CROSS REFERENCE TO RELATED APPLICATIONS

This application is a continuation-in-part of U.S. Provisional Patent Application No. 60/496,307, filed on Aug. 19, 2003, which is incorporated herein by reference in its entirety.

FIELD OF THE INVENTION

The present invention relates to digital communications. More particularly, the present invention relates to error correction circuits and methods in digital communication systems.

BACKGROUND OF THE INVENTION

A convolutional code has been widely used in many communication systems as a forward error correction (FEC) method. The Viterbi decoding algorithm is optimum for decoding of the received data, which is transmitted after convolutional encoding.

The decoding speed of the Viterbi decoding algorithm is limited by the iteration bound because the add-compare-select (ACS) recursion in the Viterbi decoding algorithm contains feedback loops. A look-ahead technique, which combines several trellis steps into one trellis step in time sequence, has been used for breaking the iteration bound of the Viterbi decoding algorithm. In the look-ahead technique, the combined branch metrics can be computed outside of the ACS recursion (referred as ACS precomputation). This allows the ACS loop to be pipelined or computed in parallel. Thereby, the decoding throughput rate can be increased. This is an advantage of the look-ahead technique. The look-ahead step (M) for a given throughput rate is obtained as the desired throughput rate divided by the ACS recursion clock rate since the overall decoding speed is limited by the allowed maximum frequency of the ACS recursion clock. Therefore, large number of look-ahead steps or high parallelism factor is needed to implement high-throughput rate Viterbi decoding.

In this invention, the ACS computation without the addition of the previous state metrics (or path metrics or accumulated branch metrics) is referred as the ACS precomputation to distinguish it from the ACS recursion, which adds the previous state metrics to the look-ahead branch metrics used for state update operation inside the feedback loop.

The main drawback of the traditional M-step look-ahead technique is that it leads to long latency for look-ahead ACS precomputation, especially when very large number of look-ahead steps is required. When the ACS precomputation unit is implemented as a pipeline structure, the ACS precomputation latency of the traditional M-step look-ahead method increases linearly with respect to the look-ahead step.

In this invention, an alternate approach is considered where the method of combining trellis steps is changed such that the inherent decoding latency can be. It combines K-trellis (where K is the encoder constraint length) steps into one trellis-step and then combines resulting sub-trellises in a layered manner (refereed as K-nested layered look-ahead, LLA). In this approach, the ACS precomputation latency can be significantly decased for high order look-ahead cases as long as the level of parallelism, M, is a multiple of the encoder constraint length, K.

The practical use of this invention is extremely important for implementation of high speed, i.e., 5 or 10 Gb/s, serializer-deserializer (SERDES), where the latency constraint is critical. The SERDES can be used in 10 Gb/s fiber channel synchronous optical network (SONET) or 10 Gb/s Ethernet local area network (LAN), etc. The low-latency Viterbi detector based on this invention may also be used in high density optical or magnetic storage y such as digital video disk (DVD) and hard disk drive (HDD) systems.

BRIEF SUMMARY OF THE INVENTION

For a binary convolutional code, parallel paths exist when the number of incoming paths into a trellis state ($2^M$) is larger than the number of trellis states ($2^{K-1}$): $2^M > 2^{K-1} \Rightarrow M \geq K$. Each trellis transition in an M-step look-ahead trellis has $2^{M-K+1}$ parallel path. As a result, combining K-trellis steps guarantees two parallel paths between any two-trellis states. Parallel paths are the paths that have the same starting trellis state and same ending trellis state. The existence of parallel paths guarantees that it is possible to use look-ahead ACS precomputation. However, if there are no parallel paths in the look-ahead trellis, only the look-ahead additions of the branch metrics ($\lambda$), which are distances between the received data and codewords, are allowed.

The main idea of this invention involves combining K-trellis steps as a pipeline structure and then combining the resulting look-ahead branch metrics as a tree structure in a layered manner to decrease the ACS precomputation latency. This leads to a regular and simple high throughput rate Viterbi decoder architecture with logarithmic increase in latency, as opposed to linear increase in traditional look-ahead, with respect to the look-ahead factor. A restriction of this method is that the look-ahead step M should be a multiple of the encoder constraint length K.

In this invention, each layer-1 processor combines K-trellis steps into one trellis step (K-nesting). The higher layer processors combine two sub-layer trellises, and each layer processor executes the ACS computations in a distributed manner referred as layered look-ahead. The ACS recursion is executed at the top layer. For each trellis state, the layer-1 processor selects one path from two parallel paths and leads to a fully connected trellis with no parallel paths. When two fully connected trellises with no parallel paths are combined into one, $2^{K-1}$ parallel paths are generated between any two-trellis states. Therefore, the layer-2 and higher layer processors select one path from $2^{K-1}$ parallel paths instead of $2^{M-K+1}$ parallel paths.

BRIEF DESCRIPTION OF THE DRAWINGS/FIGURES

The present invention is described with reference to the accompanying figures in the figures, like reference numbers indicate identical or functionally similar elements. Additionally, the left-most digit or digits of a reference number identify the figure in which the reference number first appears. The accompanying figures, which are incorporated herein and form part of the specification, illustrate the present invention and, together with the description, further serve to explain the principles of the invention and to enable a person skilled in the relevant art to make and use the invention.

DETAILED DESCRIPTION OF THE INVENTION

Figure 1:
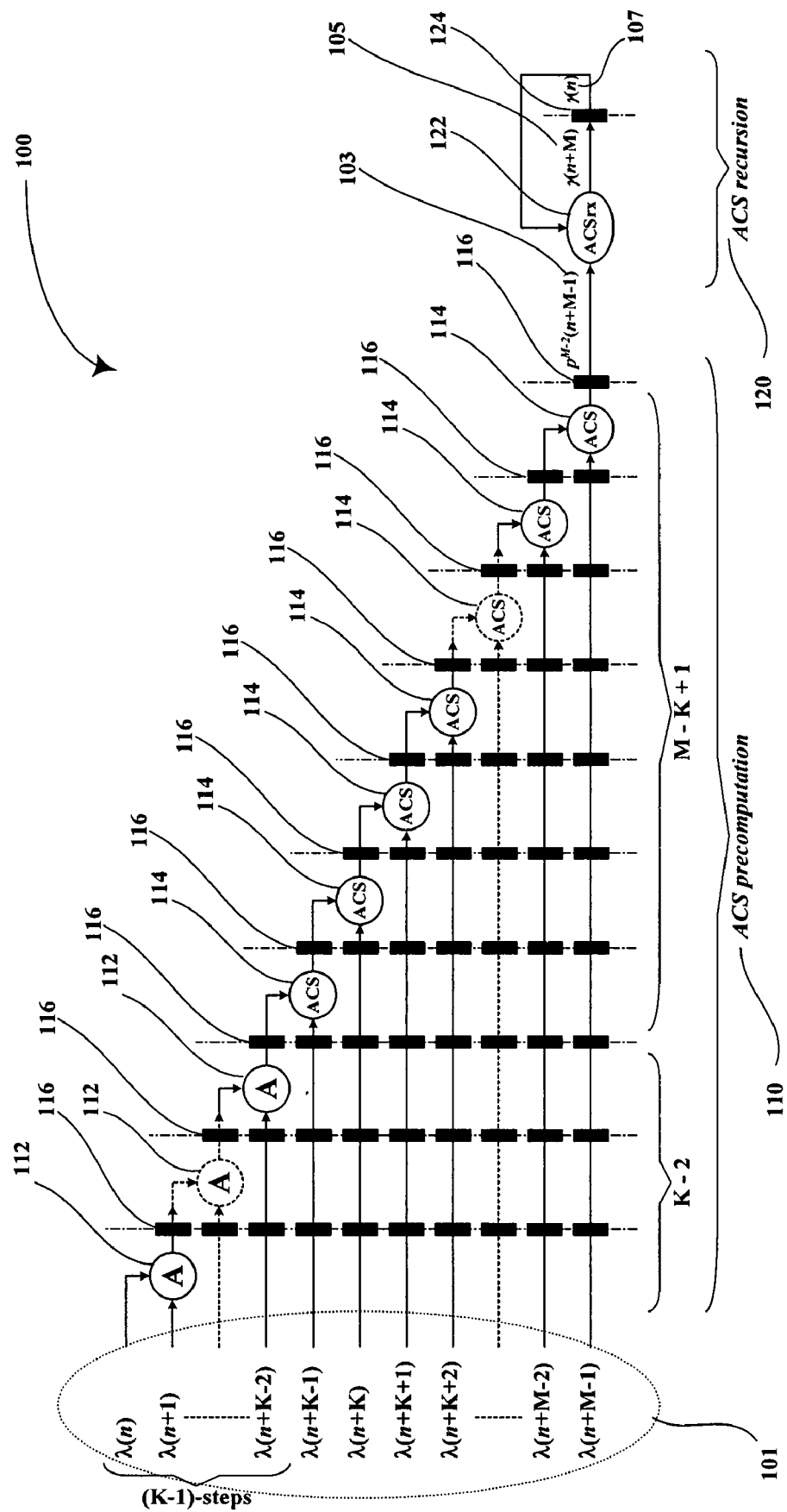
FIG. 1 illustrates a traditional M-step look-ahead Viterbi decoder circuit.

In the look-ahead technique, the combined branch metrics can be computed outside of the ACS recursion. This allows the ACS loop to be pipelined or computed in parallel. Thereby, the decoding throughput rate can be increased. This is an advantage of the look-ahead technique, which has been explored for Viterbi decoding algorithm and the dynamic programming problems. FIG. 1 illustrates that a circuit 100 consists of ACS precomputation part (circuit 110) and ACS recursion part (circuit 120) for traditional M-step look-ahead Viterbi decoding circuit.

The ACS precomputation part (circuit 110) consists of 2-input adders (circuit 112), radix-2 ACS circuits (114), and pipelining latches (circuit 116). Each radix-2 ACS circuit consists of two 2-input adders and a radix-2 compare-select (CS) circuit. Circuit 110 uses M-parallel incoming branch metrics (signal 101) for its ACS precomputation. For the first (K−1)-steps branch metrics inputs, compare-select operations are not necessary. Therefore, 2-input adders (circuit 112) can be used for those inputs. From the K-th branch metrics inputs, radix-2 ACS circuits (114) are used for add-compare-select operations. From the ACS precomputation part (circuit 110), M-step look-ahead branch metrics (signal 103) are obtained. The M-step look-ahead branch metrics (signal 103) are used as inputs of ACS recursion part (circuit 120).

The ACS recursion part (circuit 120) consists of radix-$2^{K-1}$ ACS circuits (122) and pipelining latches (circuit 124). Each radix-$2^{K-1}$ ACS circuit (122) consists of 2-input adders and a radix-$2^{k-1}$ ACS circuit. It adds M-step look-ahead branch metrics (signal 103) and state metrics (signal 107) of the previous step and performs compare-select operation to select a maximum likelihood path. The state metrics (signal 105) of the selected path is used for computation of the next ACS recursion.

Figure 2:
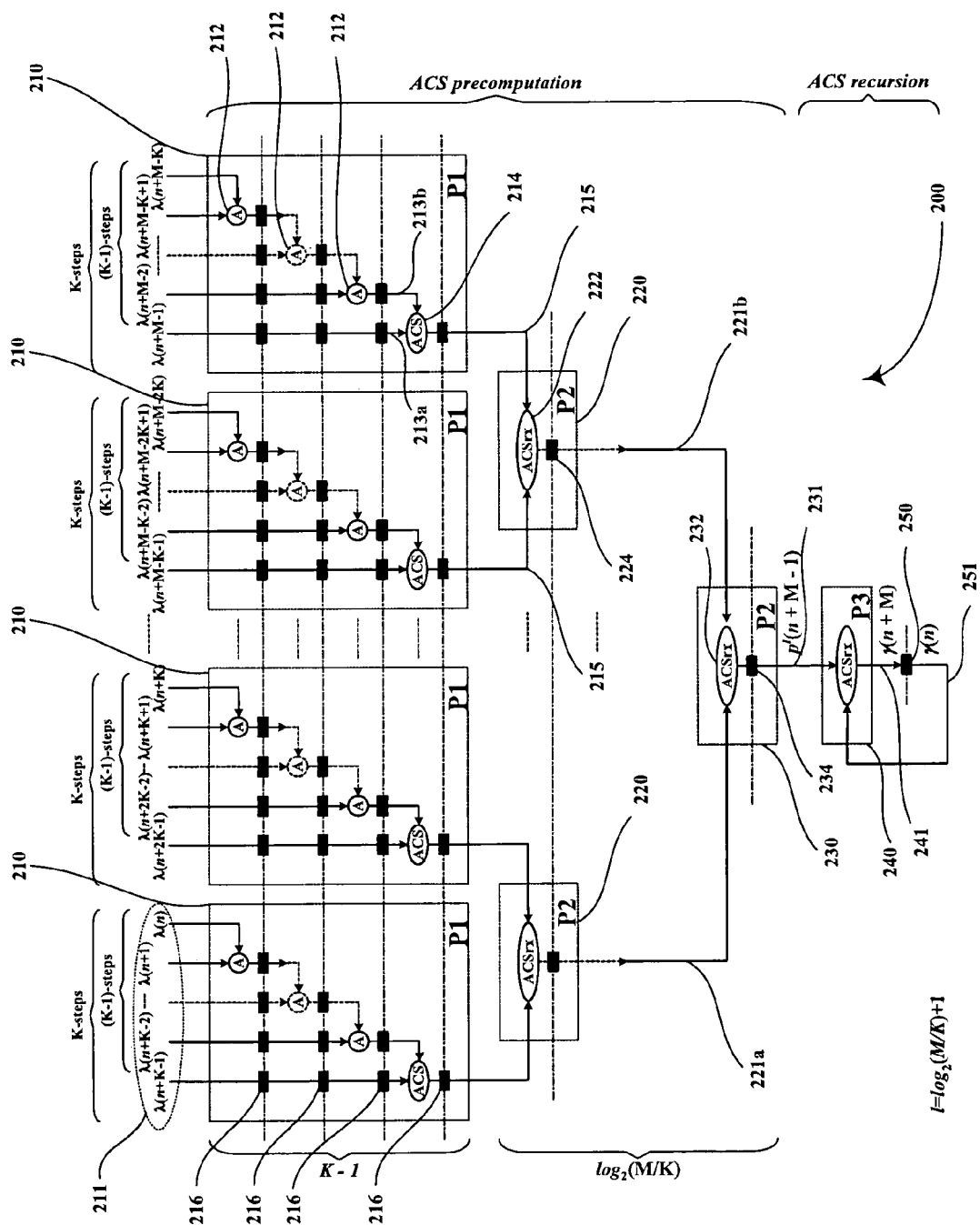
FIG. 2 illustrates a proposed M-step look-ahead Viterbi decoder circuit.

FIG. 2 illustrates the proposed M-step K-nested look-ahead Viterbi decoder circuit It also consists of ACS precomputation part (circuits 210, 220, and 230) and ACS recursion part (circuits 240 and 250). However, the present invention differs from the prior work, that is, it combines K-trellis steps as a pipeline structure and then combines the resulting look-ahead branch metrics as a tree structure in a layered manner. The proposed mK-step K-nested layered look-ahead (LLA) method, where m is a positive power-of-two integer equal to M/K, consists of ($\log_2 m+1$) ACS precomputation layers and one ACS recursion layer. This invention requires (2m−1) ACS precomputation units and one ACS recursion it as shown in FIG. 2 (circuit 200) and FIG. 3 (diagram 300).

ACS computation units (circuits 210, 220, and 230) contain P1 (circuit 210) and P2 (circuits 220 and 230) for ACS precomputation and P3 (circuit 240) for ACS recursion with pipelining latches (circuits 216, 224, 234, and 250). The required numbers of processors for ACS computation are as follows: m for P1 (circuit 210), (m−1) for P2 (circuits 220 and 230), and 1 for P3 (circuit 240).

The ACS computations are executed in a layered manner by circuits (210, 220, 230, 240, and 250) as follows.

Layer-1 processor, P1 (circuit 210): Layer-1 ACS precomputation needs m-P1 processors. Each P1 (circuit 210) executes K-step look-ahead ACS precomputation with K-parallel incoming branch metrics (signal 211) as follows:

$$p_{h,j}^1(n+K(i+1)-1) = \min\{p_{h,j}(n+K(i+1)-1), q_{h,j}(n+K(i+1)-1)\}. \quad \text{EQ. 1}$$

Here subscripts h and j stand for trellis states: $0 \leq h, j \leq 2^{K-1}-1$. The parameter i is a sequence index starting from 0. Signals $p_{h,j}(n+K(i+1)-1)$ and $q_{h,j}(n+K(i+1)-1)$ in EQ. 1 are the K-step look-ahead branch metrics of the two parallel paths between starting trellis state and ending trellis state-j, which are the sums of the K-parallel incoming branch metrics (signal 211): $\lambda_{h,0}(n+Ki) + \ldots + \lambda_{c,i}(n+K(i+1)-2) + \lambda_{l,j}(n+K(i+1)-1)$. The signal 215, $p_{h,j}^1(n+K(i+1)-1)$, is the selected K-step look-ahead branch metrics from the two parallel paths (signals 213a and 213b).

The parallel-path-select (PPS) signals for the trellis state-j in layer-1, which contain survivor path information of each selected parallel path between starting trellis state-h and ending trellis state-j, are obtained as follows:

$$PPS_{h,j,i}^1[0] = \begin{cases} 0 & \text{when } p_{h,j}(n+K(i+1)-1) \text{ is selected}, \\ 1 & \text{when } q_{h,j}(n+K(i+1)-1) \text{ is selected}. \end{cases} \quad \text{EQ. 2}$$

The superscript of PPS represents the ACS precomputation layer. In layer-1, each trellis state has $2^{K-1}$ one-bit PPS signals. These are referred as $PPS_{h,j,i}^1[0]$.

Layer-k Processor, P2 (circuits 220 and 230) for $2 \leq k \leq \log_2 m+1$: For layer-k ACS precomputation, $m/2^{k-1}$-P2 processors are needed. Each P2 executes $2^{k-1}$·K-step look-ahead ACS precomputation using two $2^{k-2}$·K-step look-ahead branch metrics as follows:

$$p_{h,j}^k(n+2^{k-1}K(i+1)-1) = \min \begin{cases} p_{h,0}^{k-1}(n+2^{k-2}K(i+1)-1) + \\ p_{0,j}^{k-1}(n+2^{k-1}K(i+1)-1), \\ p_{h,1}^{k-1}(n+2^{k-2}K(i+1)-1) + \\ p_{1,j}^{k-1}(n+2^{k-1}K(i+1)-1), \\ \ldots, \\ p_{h,N-1}^{k-1}(n+2^{k-2}K(i+1)-1) + \\ p_{N-1,j}^{k-1}(n+2^{k-1}K(i+1)-1) \end{cases} \quad \text{EQ. 3}$$

where the subscript, N, repesents the number of trellis states: $N=2^{K-1}$.

In layer-k each trellis state has $2^{K-1}$-PPS signals, which consist of (K−1)-bits because there are $2^{K-1}$ parallel paths between starting trellis state-h and ending trellis state-j with $2^{K-1}$ leading trellis states. These are referred as $PPS_{h,j,i}^{k}[K-2:0]$.

ACS recursion processor (circuits 240 and 250): The ACS recursion processor consists of a P3 (circuit 240) and pipelining latches (circuit 250). The P3 and the pipelining latch execute the ACS recursion using $2^{m-1}$·K-step look-ahead branch metrics and the previous state metrics, $\gamma_j(n+mKi)$, as follows:

$$\gamma_j(n+mK(i+1)) = \min\begin{Bmatrix} \gamma_0(n+mKi) + p_{0,j}^l(n+mK(i+1)-1), \\ \gamma_1(n+mKi) + p_{1,j}^l(n+mK(i+1)-1), \\ \ldots, \\ \gamma_{N-1}(n+mKi) + p_{N-1,j}^l(n+mK(i+1)-1) \end{Bmatrix} \quad \text{EQ. 4}$$

where signal $p_{h,j}^l(n+mK(i+1)-1)$ is the mK-step look-ahead branch metric that starts from trellis state and ends a trellis state-j and $l=\log_2 m+1$. The parameter $\gamma_j(n+mK(i+1))$ is the new state metrics of the trellis state-j.

In P3 (circuit 240), each trellis state needs $2^{K-1}$ path-select (PS) signals, which consist of (K−1)-bits to distinguish $2^{K-1}$ incoming paths to a trellis state-j from $2^{K-1}$ leading trellis states: $PS_{j,i}[K-2:0]$.

Figure 3:
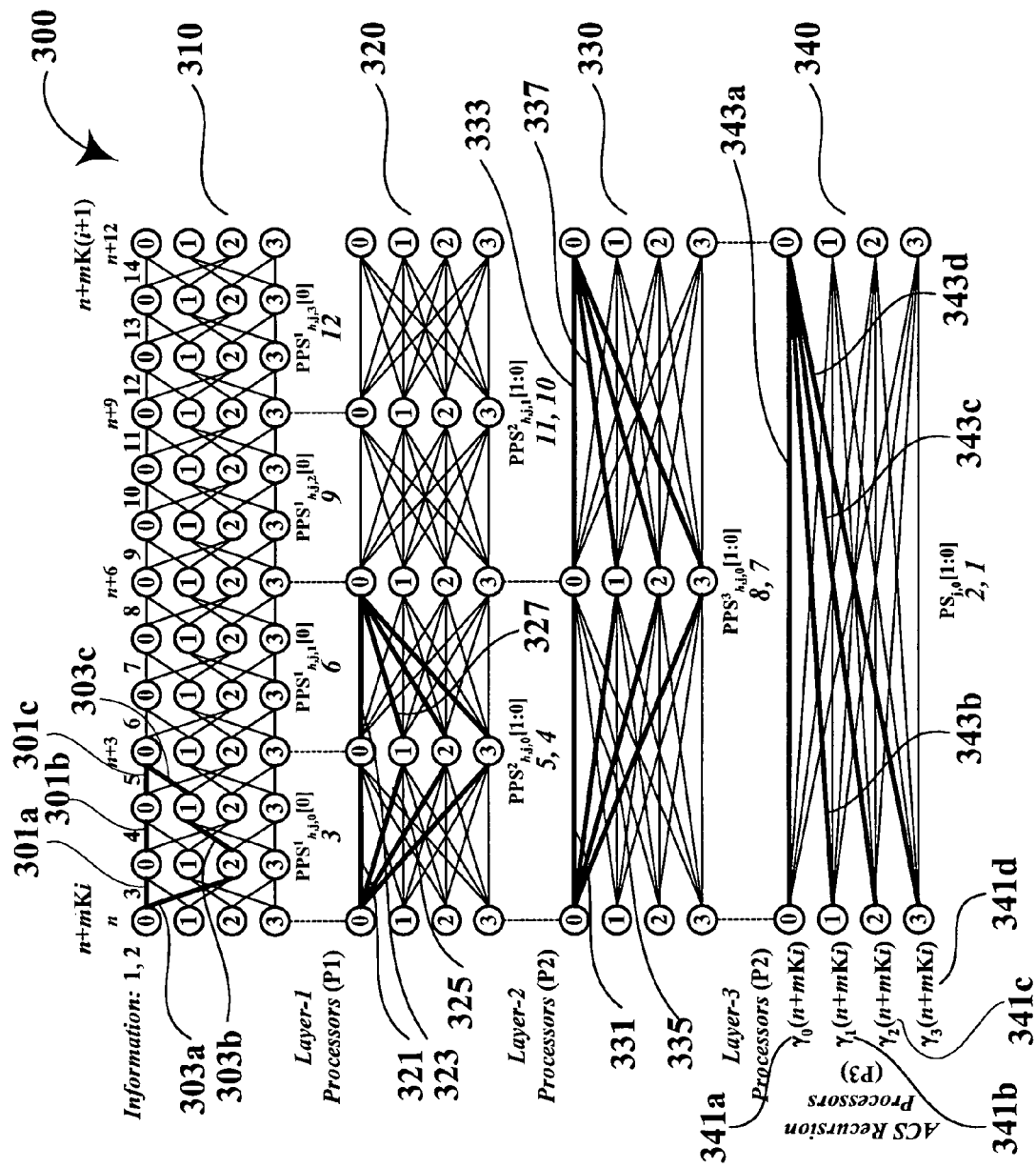
FIG. 3 illustrates trellis diagrams of the proposed M-step K-nested layered look-ahead method for the encoder constraint length, K, equal to 3 and the look-ahead step, M, equal to 12.

In FIG. 3, diagram 310 illustrates trellis diagrams for the encoder constraint length K=3 and the look-ahead step M=12. Each layer-1 processor combines K-trellis steps (signal 301a+signal 301b+signal 301c and signal 303a+signal 303b+signal 303c) and selects a trellis path (signal 321) from two parallel trellis paths (signal 301a+signal 301b+signal 301c and signal 303a+signal 303b+signal 303c).

The diagram 320 is the resulting trellis diagram of the layer-1 processor. Each layer-2 processor combines resulting signals (signal 321+signal 323 and signal 325+signal 327) of layer-1 processors and selects a trellis path (signal 331) from two parallel trellis paths (signal 321+signal 323 and signal 325+signal 327).

The diagram 330 is the resulting trellis diagram of the layer-2 processor. Each layer-3 processor combines resulting signals (signal 331+signal 333 and signal 335+signal 337) of layer-2 processors and selects a trellis path (signal 341) from two parallel trellis paths (signal 331+signal 333 and signal 335+signal 337).

The diagram 340 is the resulting trellis diagram of the layer-3 processor. Each ACS recursion processor adds signals (signal 341a+signal 343a, signal 341b+signal 343b, signal 341c+signal 343c, and signal 341d+signal 343d) and selects a trellis path from four trellis paths (signal 341a+signal 343a, signal 341b+signal 343b, signal 341c+signal 343c, and signal 341d+signal 343d).

In FIG. 3, the numbers (1 through 12) represent the decoded data sequence. $PPS_{h,j,0}^1[0]$ becomes the first decoded data since the $PS_{j,0}[0:1]$ represent the encoder initial states. The $PS_{j,l}[0:1]$ become the $13^{th}$ and the $14^{th}$ decoded data, etc. Consequently, the survivor path information for mK-step look-ahead method consists of mK-bits per each trellis state: mK−(K−1) bits for PPS and (K−1) bits for PS. With this mK-parallel survivor path information, the effective decoding speed of the Viterbi decoder can be increased by a factor of mK.

The mK-step K-nested LLA Viterbi decoder consists of serial-to-parallel converter (SPC), branch metrics calculator (BMC), ACS computation units, and survivor path management (M#) units. The serially received data sequence is converted into parallel data sequences by the SPC. The BMC computes Euclidean (soft decision) or Hamming (hard decision) distances of the received data with respect to the codeword. Architectures of SPC and BMC are for the traditional M-step look-ahead method and the proposed method are same and not considered in this invention.

Figure 6:
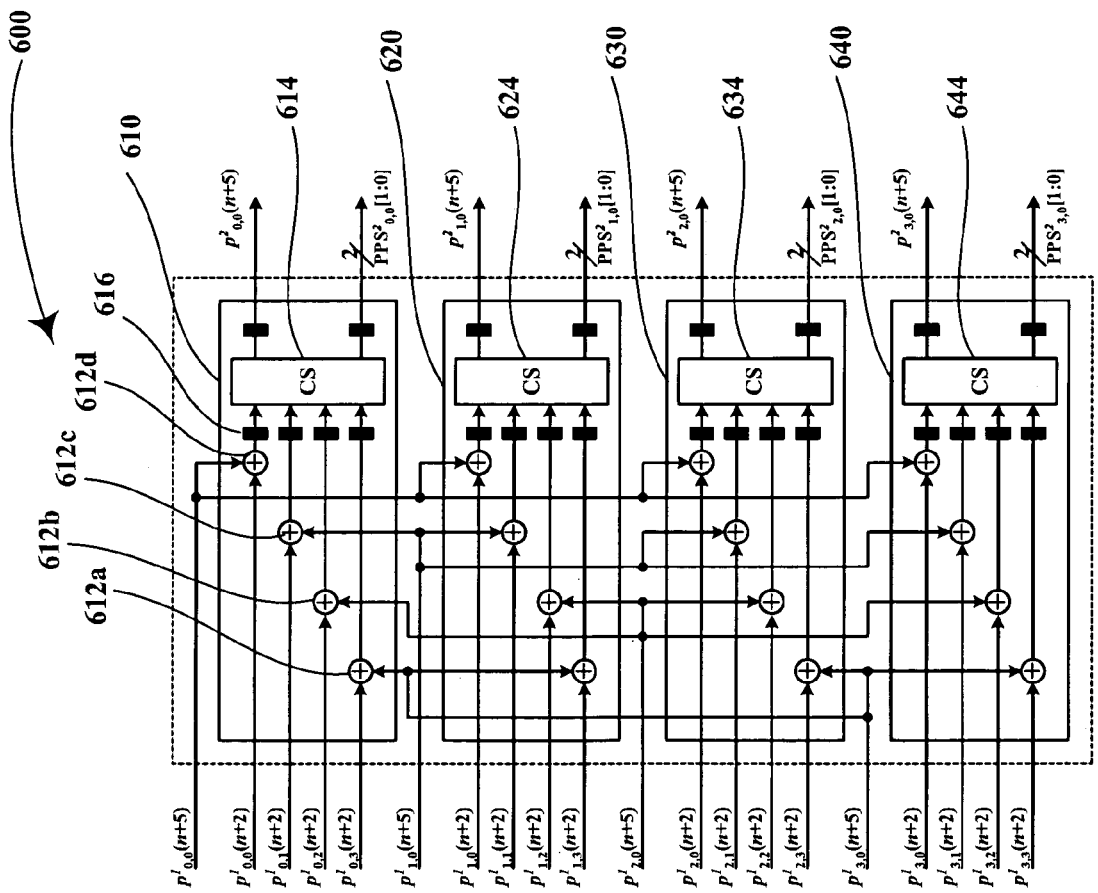
FIG. 6 illustrates the proposed layer-2 processor (P2) circuit of FIG. 4.

FIG. 6 (circuit 400) illustrates an example of this invention for 12-step K-nested look-ahead Viterbi decoder circuit with K=3. It consists of P1 processors (circuits 402, 404, 406, and 408), P2 processors (circuits 410, 412, and 414), ACS recursion processor (circuits 416 and 434), survivor path management circuits (420, 422, 424, and 426), and pipelining latches (circuits 430, 432, and 434).

In the layer-1 ACS precomputation, four P1 processors (circuits 402, 404, 406, and 408), which have 3-parallel incoming branch metrics each, are needed. Each P1 executes the ACS precomputation as follows: add 3-parallel incoming branch metrics and compare select two resulting parallel paths.

Each P1 processor executes the ACS precomputation for $\{\lambda(n), \lambda(n+1), \text{and } \lambda(n+2)\}$, $\{\lambda(n+3), \lambda(n+4), \text{and } \lambda(n+5)\}$, $\{\lambda(n+6), \lambda(n+7), \text{and } \lambda(n+8)\}$, and $\{\lambda(n+9), \lambda(n+10), \text{and } \lambda(n+11)\}$ as follows:

$$p_{0,0}(n+3i+2)=\lambda_{0,0}(n+3i)+\lambda_{0,0}(n+3i+1)+\lambda_{0,0}(n+3i+2),$$

$$q_{0,0}(n+3i+2)=\lambda_{0,2}(n+3i)+\lambda_{2,1}(n+3i+1)+\lambda_{1,0}(n+3i+2),$$

$$p_{1,0}(n+3i+2)=\lambda_{1,0}(n+3i)+\lambda_{0,0}(n+3i+1)+\lambda_{0,0}(n+3i+2),$$

$$q_{1,0}(n+3i+2)=\lambda_{1,2}(n+3i)+\lambda_{2,1}(n+3i+1)+\lambda_{1,0}(n+3i+2),$$

$$p_{2,0}(n+3i+2)=\lambda_{2,1}(n+3i)+\lambda_{1,0}(n+3i+1)+\lambda_{0,0}(n+3i+2),$$

$$q_{2,0}(n+3i+2)=\lambda_{2,3}(n+3i)+\lambda_{3,1}(n+3i+1)+\lambda_{1,0}(n+3i+2),$$

$$p_{3,0}(n+3i+2)=\lambda_{3,1}(n+3i)+\lambda_{1,0}(n+3i+1)+\lambda_{0,0}(n+3i+2),$$

$$q_{3,0}(n+3i+2)=\lambda_{3,3}(n+3i)+\lambda_{3,1}(n+3i+1)+\lambda_{1,0}(n+3i+2). \quad \text{EQ. 5}$$

where index i=0, 1, 2, and 3. $p_{h,j}(n+3i+2)$ and $q_{h,j}(n+3i+2)$ are 3-step look-ahead branch metrics of two parallel paths, which start from trellis state-h and end at trellis state-j. EQ. 5 only shows that the ACS precomputations for trellis state-0. The ACS precomputations for other trellis states are similar with that of the trellis state-0.

The common teems in the K-nested look-ahead branch metrics computation equations (EQ. 5) for trellis state-j can be grouped as $$A=\lambda_{0,0}(n+3i+1)+\lambda_{0,0}(n+3i+2),$$

$$B=\lambda_{1,0}(n+3i+1)+\lambda_{0,0}(n+3i+2),$$

$$C=\lambda_{2,1}(n+3i+1)+\lambda_{1,0}(n+3i+2),$$

$$D=\lambda_{3,1}(n+3i+1)+\lambda_{1,0}(n+3i+2). \quad \text{EQ. 6}$$

For each trellis state-j, P1 selects the minimum paths as follows $$p_{h,j}^1(n+3i+2)=\min\{p_{h,j}(n+3i+2),q_{h,j}(n+3i+2)\} \quad \text{EQ. 7}$$

where subscripts h and j stand for trellis states: $0 \leq h,j \leq 3$.

Figure 5:
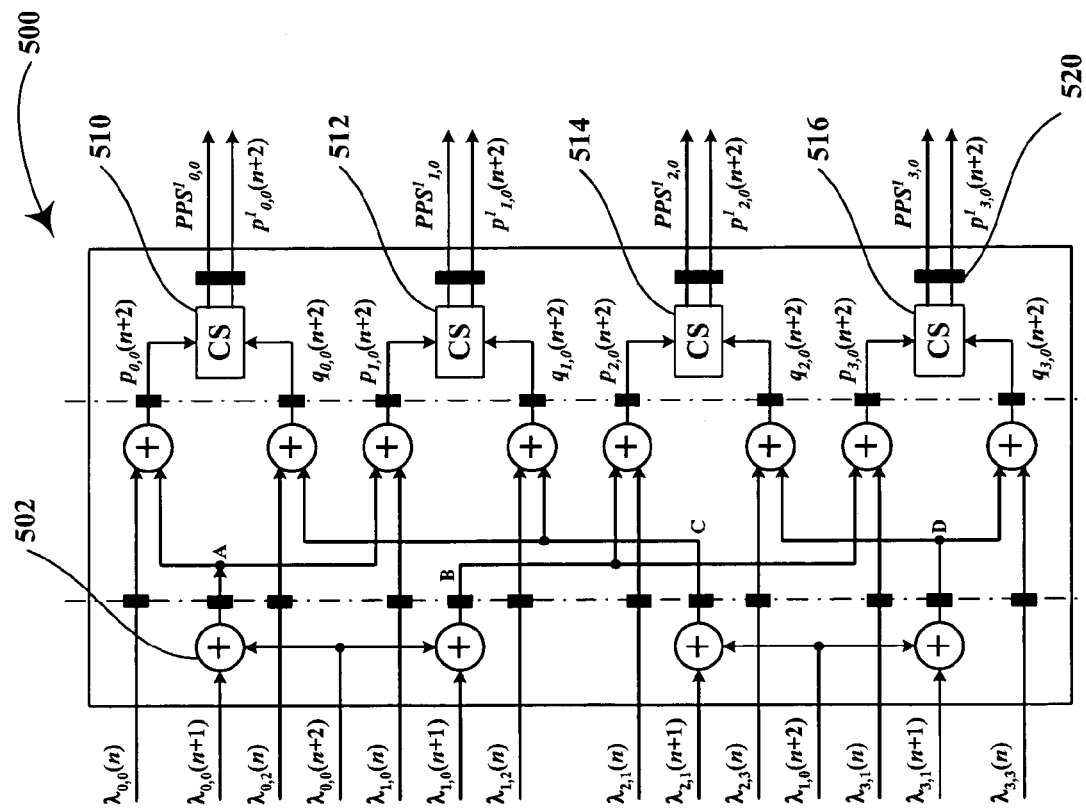
FIG. 5 illustrates the proposed layer-1 processor (P1) circuit of FIG. 4.

FIG. 5 (circuit 500) illustrates the P1 processor for trellis state-0 for the case of index i=0 in EQ. 5, EQ. 6, and EQ. 7. It has 12 two-input adders (circuit 502), 4 compare-select (CS) circuits (510,512,514, and 516), and pipelining latches (circuit 520). The required number of two input adders and radix-2 CS units for layer-1 processing are 192 and 64, respectively.

Four PPS signals are needed for each trellis state: $PPS_{0,j,i}^1[0]$, $PPS_{1,j,i}^1[0]$, $PPS_{2,j,i}^1[0]$, and $PPS_{3,j,i}^1[0]$, which consist of one-bit each, since each trellis state has four selected 3-step look-ahead branch metrics, such as $p_{0,j}^1$, $p_{1,j}^1$, $p_{2,j}^1$, and $p_{3,j}^1$.

In layer-k, where $2 \leq k \leq 3$, P2 processors select the minimum paths for trellis state-j as follows:

$$p_{h,j}^k(n + 2^{k-1}3(i+1) - 1) = \min \begin{cases} p_{h,0}^{k-1}(n + 2^{k-2}3(i+1) - 1) + \\ p_{0,j}^{k-1}(n + 2^{k-1}3(i+1) - 1), \\ p_{h,1}^{k-1}(n + 2^{k-2}3(i+1) - 1) + \\ p_{1,j}^{k-1}(n + 2^{k-1}3(i+1) - 1), \\ p_{h,2}^{k-1}(n + 2^{k-2}3(i+1) - 1) + \\ p_{2,j}^{k-1}(n + 2^{k-1}3(i+1) - 1), \\ p_{h,3}^{k-1}(n + 2^{k-2}3(i+1) - 1) + \\ p_{3,j}^{k-1}(n + 2^{k-1}3(i+1) - 1) \end{cases} \quad \text{EQ. 8}$$

Each trellis state has four PPS signals: $PPS_{0,j,i}^k[1:0]$, $PPS_{2,j,i}^k[1:0]$, $PPS_{1,j,i}^k[1:0]$, and $PPS_{3,j,i}^k[1:0]$, which consist of two-bits each.

FIG. 6 (circuit 600) illustrates the P2 processor in layer-2 for trellis state-0 for the case of index i=0 in EQ. 8. It has 16 two-input adders (circuits 612a, 612b, 612c, and 612d), 4 radix-4 compare-select (CS) circuits (614, 624, 634, and 644), and pipelining latches (circuit 616). For layer-2 processing, the required number of two input adders and radix-4 CS units are 128 and 32, respectively.

Figure 7:
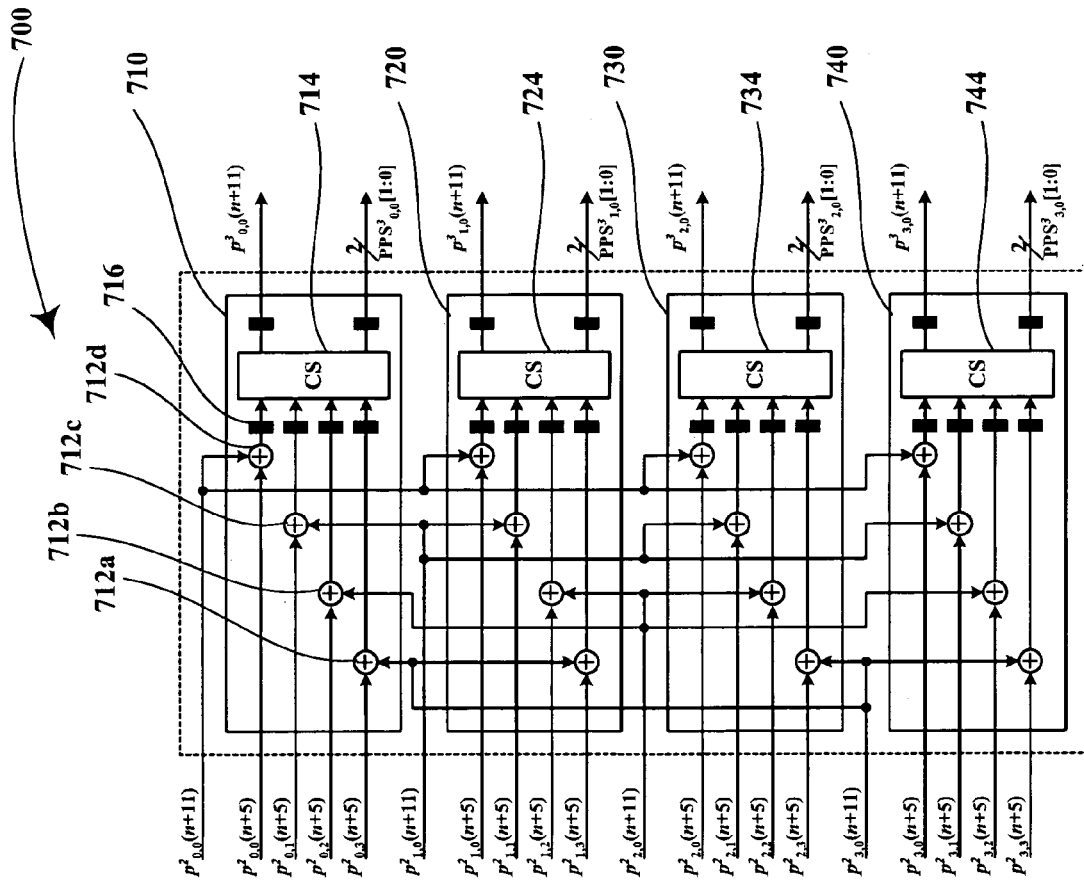
FIG. 7 illustrates the proposed layer-3 processor (P2) circuit of FIG. 4. For $2 \leq k \leq \log_2(M/K)+1$, each layer-k processor uses same type of processor, P2.

FIG. 7 (circuit 700) illustrates the P2 processor in layer-3 for trellis state-0 for the case of index i=0 in EQ. 8. It has 16 two input adders (circuits 712a, 712b, 712c, and 712d), 4 radix-4 compare-select (CS) circuits (714, 724, 734, and 744), and pipelining latches (circuit 716). For layer-2 processing, the required number of two input adders and radix-4 CS units are 64 and 16, respectively.

For each trellis state-j, the P3's execute the ACS recursions as $$\gamma_j(n+12) = \min \begin{cases} \gamma_0(n) + p_{0,j}^3(n+11), \\ \gamma_1(n) + p_{1,j}^3(n+11), \\ \gamma_2(n) + p_{2,j}^3(n+11), \\ \gamma_3(n) + p_{3,j}^3(n+11) \end{cases} \quad \text{EQ. 9}$$

where the subscript-j=0, 1, 2, and 3 when K=3. For each trellis state, P3 produces one-survivor path information: $PS_{j,i}[1:0]$, which consists of two bits.

Figure 8:
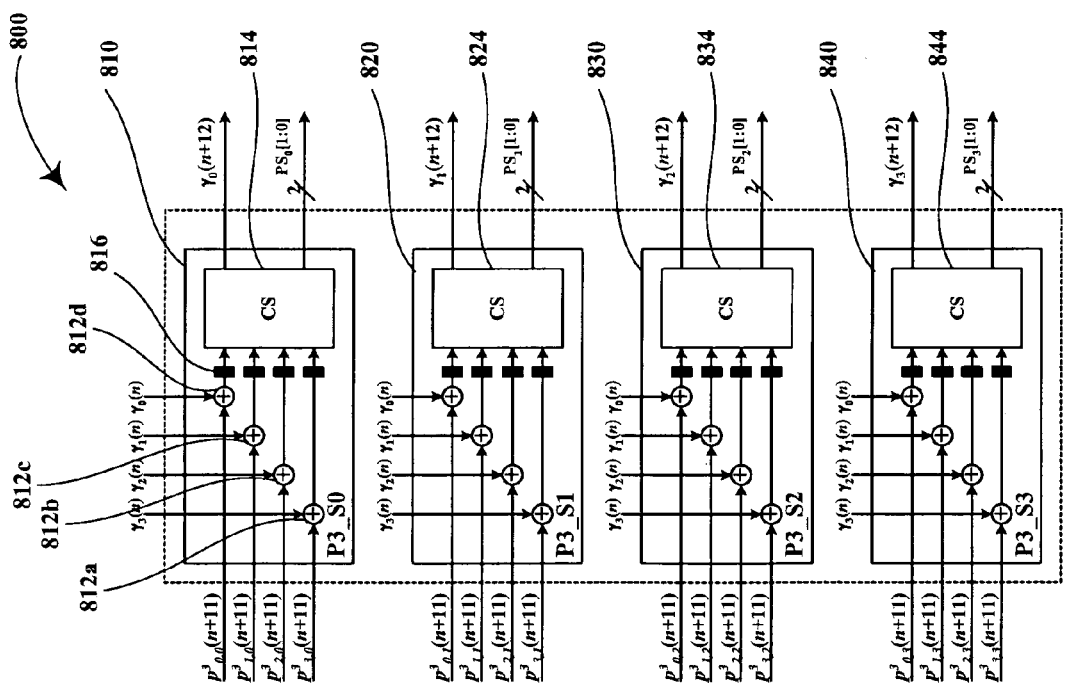
FIG. 8 illustrates the proposed ACS recursion processor (P3) circuit of FIG. 4.

FIG. 8 (circuit 800) illustrates the P3 processor for trellis state-0, which is the case for the subscript j=0 in EQ. 9. It has 16 two input adders (circuits 812a, 812b, 812c, and 812d), 4 radix-4 compare-select (CS) circuits (814, 824, 834, and 844), and pipelining latches (circuit 816). The required number of two input adders and radix-4 CS units for ACS recursion processing are 16 and 4, respectively.

In FIG. 5-8, CS represents a compare-select unit, which compares look-ahead branch metrics and selects a branch at has minimum metrics. The CS in P2 and P3 can be implemented by using a staged architecture, or a branch local architecture. The present invention considers a staged-CS architecture, where $2^{K-1}$ branches can be compared in (K−1) stages of compare-select operations. The latency ($L_{CS\_staged}$) and the complexity ($C_{CS\_staged}$) of radix-R staged CS architecture are as follows:

$$L_{CS\_staged} = \log_2 R \quad \text{EQ. 10}$$

$$C_{CS\_staged} = R - 1 \quad \text{EQ. 11}$$

In EQ. 11, the complexity represents the number of two input adders (or subtractors) for compare operations.

The survivor path information is easily controlled in a step by step manner, sonar in Table I, since the proposed 12-step K-nested LLA method has the layered structure. The layer-1 survivor path signals ($PPS_{h,j,i}^1[0]$ and $PPS_{1,j,i+1}^1[0]$) are selected by the layer-2 survivor path signal ($PPS_{h,j,i}^2[1:0]$). The layer-2 survivor path signals ($PPS_{h,j,i}^2[1:0]$ and $PPS_{h,j,i+1}^2[1:0]$) are selected by the layer-3 survivor path signal ($PPS_{h,j,i}^3[1:0]$).

TABLE I

THE FUNCTION OF SURVIVOR PATH MANAGEMENT UNITS

| $PPS^2_{h,j,i}[1:0]$ | M2: $Y^2_{h,j,i}[0:3]$ |
|---|---|
| 00 | $PPS^1_{h,0,i}[0]$ & $PPS^2_{h,j,i}[0:1]$ & $PPS^1_{0,j,i+1}[0]$ |
| 01 | $PPS^1_{h,1,i}[0]$ & $PPS^2_{h,j,i}[0:1]$ & $PPS^1_{1,j,i+1}[0]$ |
| 10 | $PPS^1_{h,2,i}[0]$ & $PPS^2_{h,j,i}[0:1]$ & $PPS^1_{2,j,i+1}[0]$ |
| 11 | $PPS^1_{h,3,i}[0]$ & $PPS^2_{h,j,i}[0:1]$ & $PPS^1_{3,j,i+1}[0]$ |
| $PPS^3_{h,j,i}[1:0]$ | M3: $Y^3_{h,j,i}[0:9]$ |
| 00 | $Y^2_{h,0,i}[0:3]$ & $PPS^3_{h,j,i}[0:1]$ & $Y^2_{0,j,i+1}[0:3]$ |
| 01 | $Y^2_{h,1,i}[0:3]$ & $PPS^3_{h,j,i}[0:1]$ & $Y^2_{1,j,i+1}[0:3]$ |
| 10 | $Y^2_{h,2,i}[0:3]$ & $PPS^3_{h,j,i}[0:1]$ & $Y^2_{2,j,i+1}[0:3]$ |
| 11 | $Y^2_{h,3,i}[0:3]$ & $PPS^3_{h,j,i}[0:1]$ & $Y^2_{3,j,i+1}[0:3]$ |
| $PS_{j,i}[1:0]$ | MA: $Y^{ACSr}_{j,i}[0:11]$ |
| 00 | $PS_{j,i}[0:1]$ & $Y^3_{0,j,i}[0:9]$ |
| 01 | $PS_{j,i}[0:1]$ & $Y^3_{1,j,i}[0:9]$ |
| 10 | $PS_{j,i}[0:1]$ & $Y^3_{2,j,i}[0:9]$ |
| 11 | $PS_{j,i}[0:1]$ & $Y^3_{3,j,i}[0:9]$ |

The survivor path management (SPM: M2, M3, and MA) circuits (900, 1000, and 1100) are modified multiplexers for survivor path selection in each ACS computation layer. They select and rearrange the PPS's of the sub-layers. The required number of SPM units is the same as the number of P2 and P3 units, since layer-1 does not need SPM.

Figure 9:
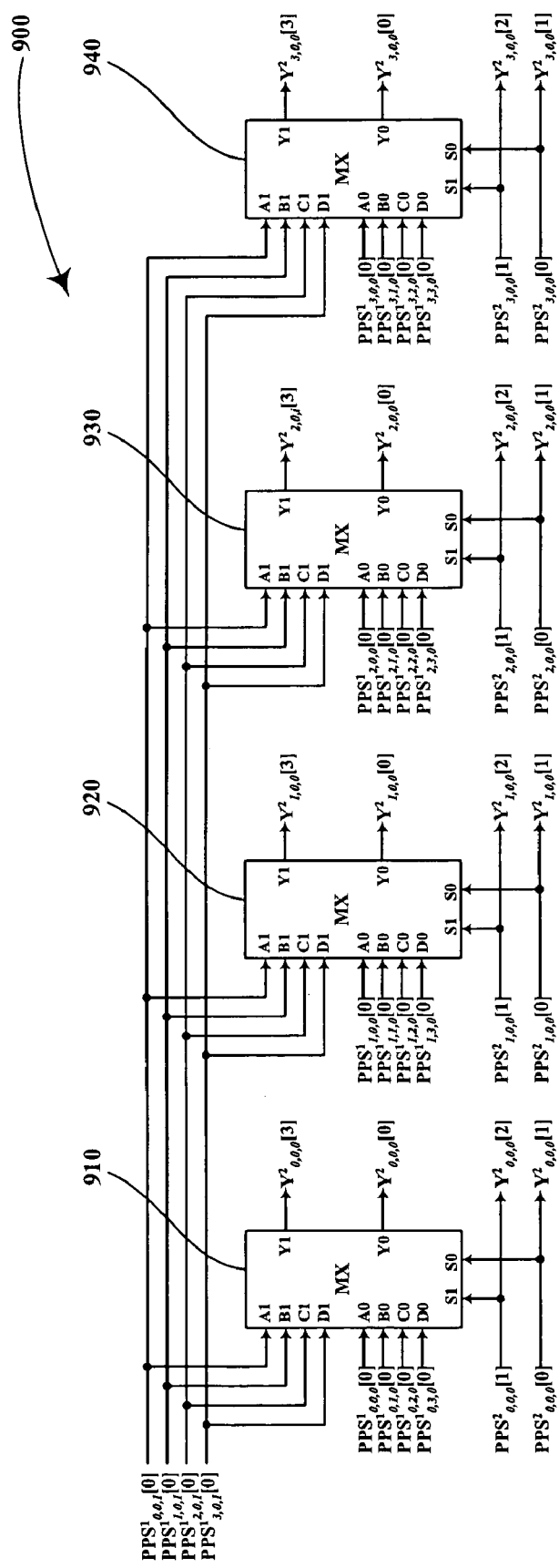
FIG. 9 illustrates the proposed survivor path management circuit for layer-2 (M2) of FIG. 4.

In M2, signal $PPS_{h,j,i}^2[1:0]$ selects one PPS signal pair from four PPS signal pairs which start at trellis state-h and end at trellis state-j according to its value and rearrange them as an output $Y_{h,j,i}^2[0:3]$. In FIG. 9 (circuit 900), circuit 910 manages the survivor path for the trellis path from the previous trellis state-0 to the present trellis state-0 in layer-2. Circuit 920 manages the survivor path for the trellis path from the previous trellis state-1 to the present trellis state-0 in layer-2. Circuit 930 manages the survivor path for the trellis path from the previous trellis state-2 to the present trellis state-0 in layer-2. Circuit 940 manages the survivor path for the trellis path from the previous trellis state-3 to the present trellis state-0 in layer-2. The function of M2 is shown in Table I.

Figure 10:
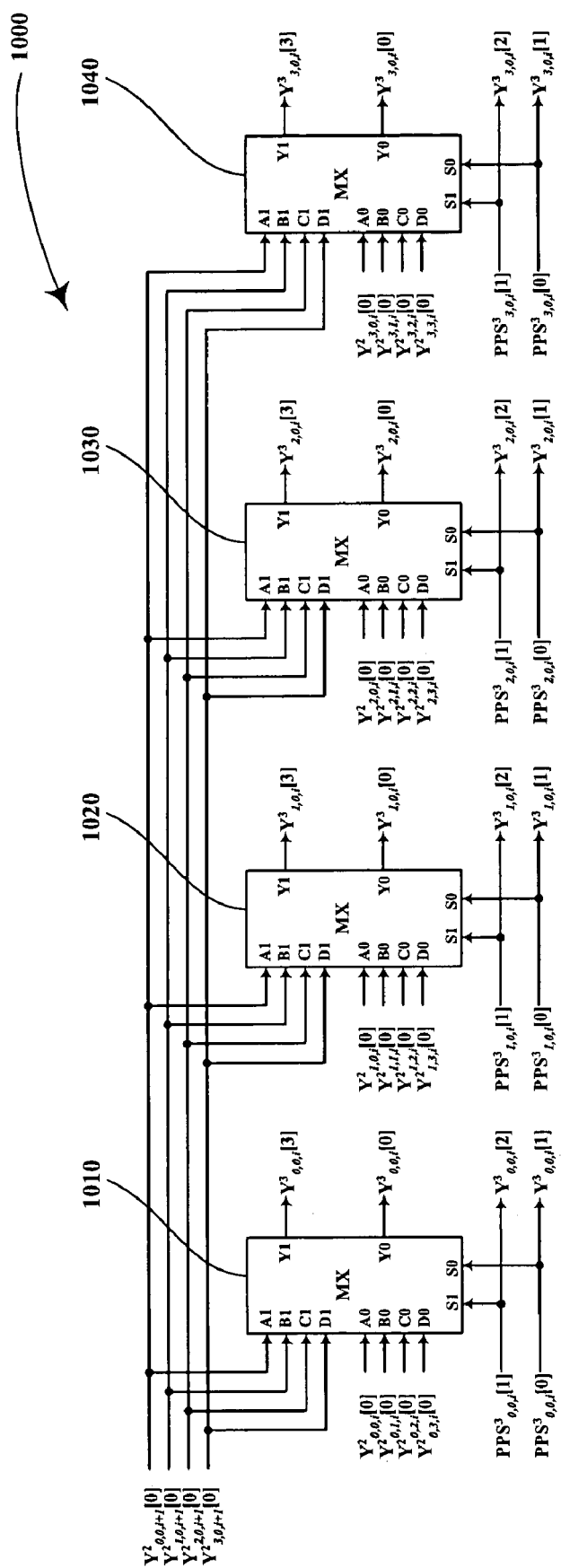
FIG. 10 illustrates the proposed survivor path management circuit for layer-3 (M3) of FIG. 4.

In M3, $PPS_{h,j,i}^3[1:0]$ selects one PPS signal pair from four PPS signal pairs which start at trellis state-h and end at trellis state-j according to its value and rearrange them as an output $Y_{h,j,i}{}^3[0:9]$. In FIG. 10 (circuit 1000), circuit 1010 manages the survivor path for the trellis path from the previous trellis state-0 to the present trellis state-3 in layer-3. Circuit 1020 manages the survivor path for the trellis path from the previous trellis state-1 to the present trellis state-0 in layer-3. Circuit 1030 manages the survivor path for the trellis path from the previous trellis state-2 to the present trellis state in layer-3. Circuit 1040 manages the survivor path for the trellis path from the previous trellis state-3 to the present trellis state-0 in layer-3. The function of M3 is shown in Table I.

Figure 11:
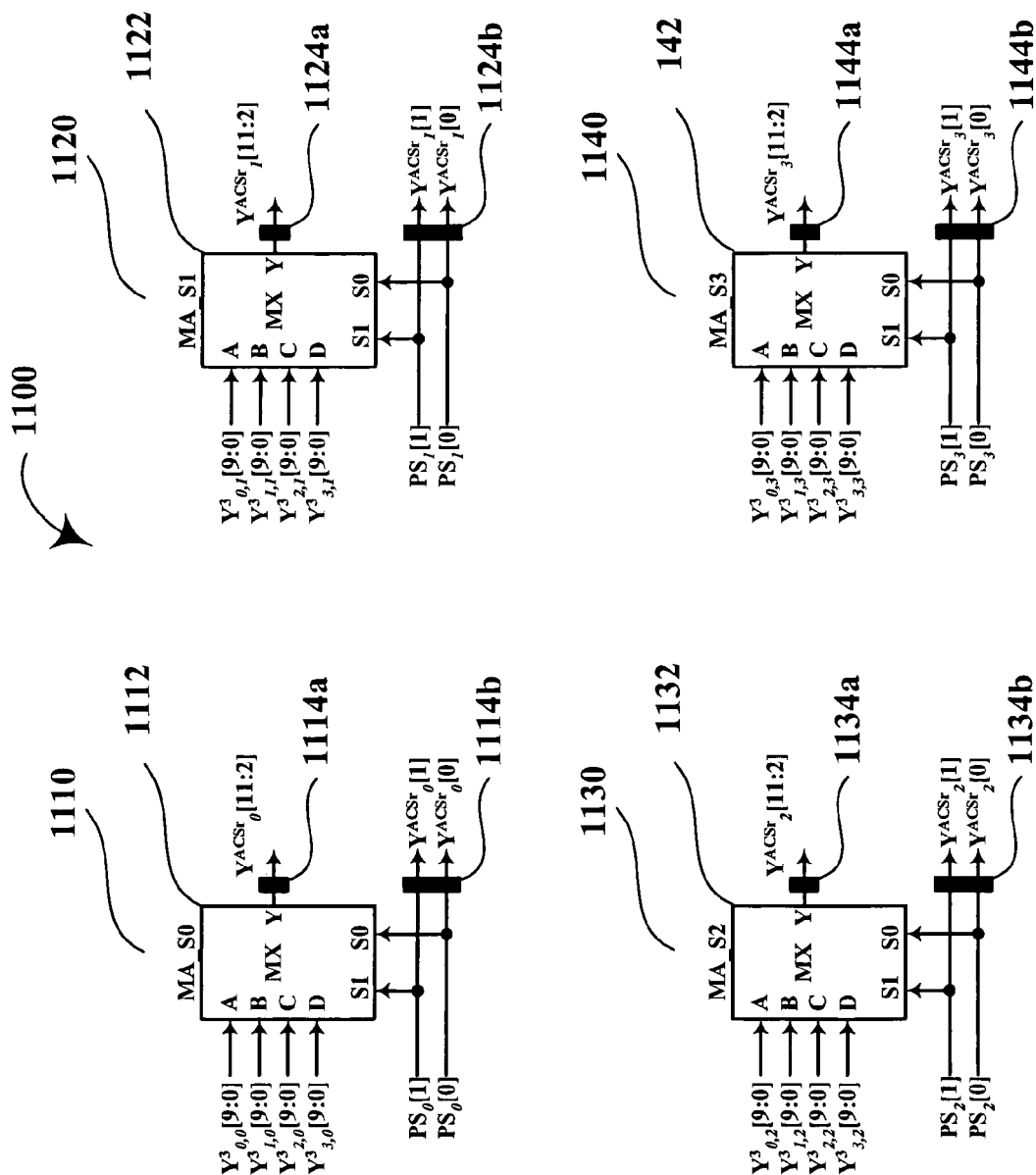
FIG. 11 illustrates the proposed survivor path management circuit for ACS recursion part (MA) of FIG. 4.

In MA, $PS_{j,i}[1:0]$ selects one PPS signal from four PPS signals and concatenates it with the selected PPS signal. In FIG. 11 (circuit 1100), circuit 1110 manages the survivor path for the trellis path from the previous trellis state-0 to the present trellis state-0 in ACS recursion layer. Circuit 1120 manages the survivor path for the trellis path from the previous trellis state-1 to the present trellis state-0 in ACS recursion layer. Circuit 1130 manages the survivor path for the trellis path from the previous trellis state-2 to the present trellis state-0 in ACS recursion layer. Circuit 1140 manages the survivor path for the trellis path from the previous trellis state-3 to the present trellis state-0 in ACS recursion layer. The function of MA is shown in Table I.

The $$Y_{j,i}^{ACSr}[0:11]$$

signals become the decoded data sequence when the trellis state-j has the smallest state metrics. When the look-ahead step is large (e.g., mK≧4K), all states have the same $Y^{ACSr}$, i.e., $$Y_{0,i}^{ACSr} = Y_{1,i}^{ACSr} = Y_{2,i}^{ACSr} = Y_{3,i}^{ACSr}.$$

Figure 4:
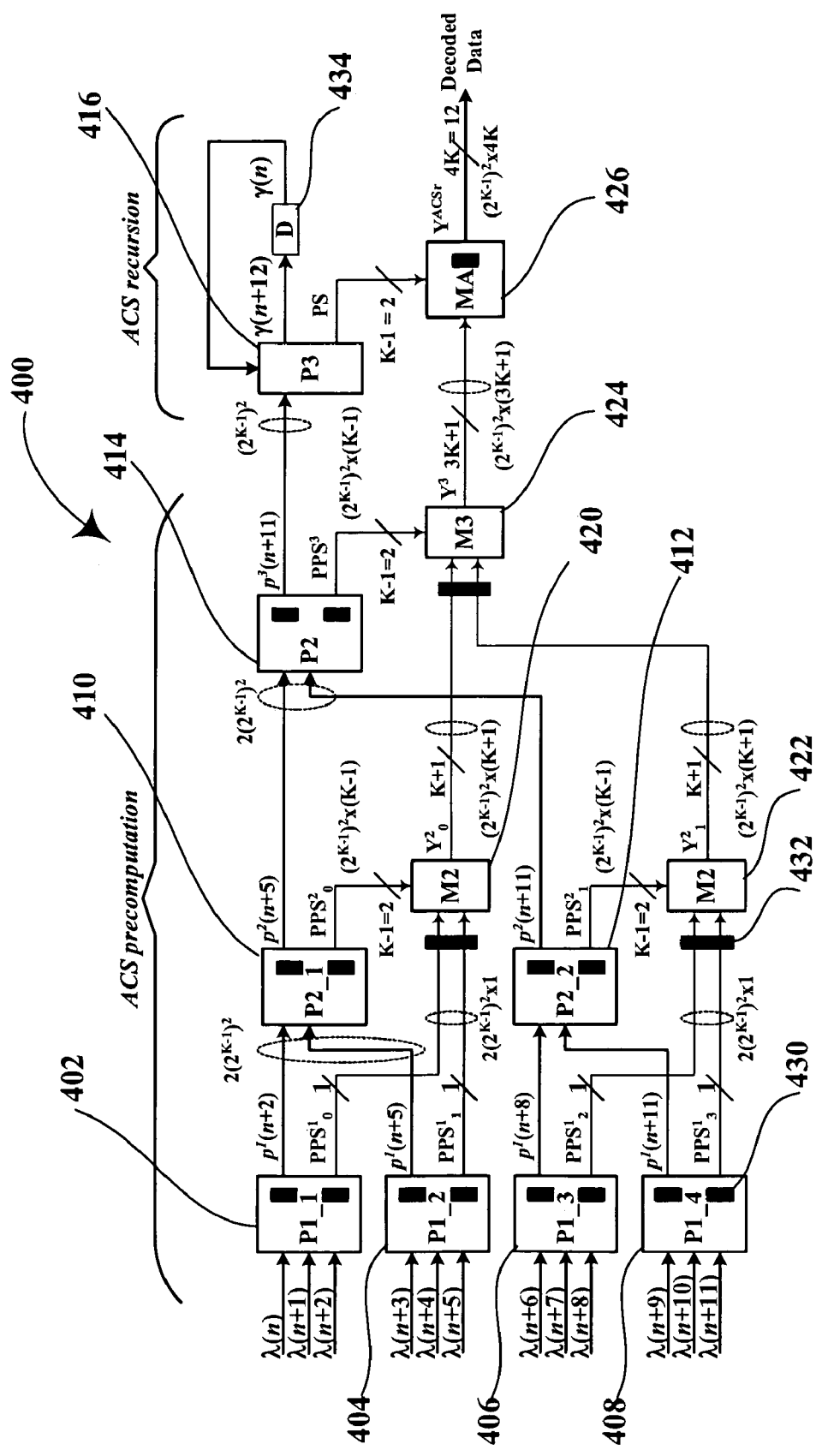
FIG. 4 illustrates an example of the proposed M-step K-nested LLA Viterbi decoder circuit for M=12 and K=3.

Therefore, any one of the $Y^{ACSr}$ sequences can be used as the decoded data sequence without minimum state finding as shown in FIG. 4.

$$Y_{j,i}^{ACSr}[0]$$

becomes the first decoded data bit. This survivor path management method can be systematically expanded for higher order look-ahead architectures.

MA processors (circuits 1110, 1120, 1130, and 1140) have 4-to-1 multiplexers (circuits 1112, 1122, 1132, and 1142) and pipelining latches (circuits 1114a, 1114b, 1124a, 1124b, 1134a, 1134b, 1144a, and 1144b).

The latency of ACS precomputation for the proposed ($L_{proposed}$) and the traditional ($L_{conv}$) M-step look-ahead architecture can be calculated as follows:

$$L_{proposed} = L_{proposed\_add} + L_{CS\_radix-2} + \quad\quad\text{EQ. 12}$$
$$(\log_2(M/K)) \cdot L_{CS\_radix-2^{K-1}}$$
$$= ((K-1) + \log_2(M/K)) + 1 +$$

-continued
$$(\log_2(M/K)) \cdot L_{CS\_radix-2^{K-1}}$$
$$= K + K \cdot \log_2(M/K)$$

$$L_{conv} = L_{conv\_add} + (M - K + 1) \cdot L_{CS\_radix-2} \quad\quad\text{EQ. 13}$$
$$= (M-1) + (M-K+1)$$
$$= 2M - K$$

In EQ. 12, the first term K comes from computing the parallel branch metrics and CS of the sub-trellis, and the second term $K \cdot \log_2$ (M/K) corresponds to the ACS unit in each layered stage. As shown in FIG. 1-2 and EQ. 12-13, the ACS precomputation latency increases linearly with respect to the look-ahead step M and logarithmically with respect to M/K for the traditional and for the proposed methods, respectively. If M/K is not a power-of-two, $\lceil \log_2 (M/K) \rceil$ is used for latency calculation instead of $\log_2$ (M/K) in EQ. 12. Where the function $\lceil x \rceil$ is the smallest integer greater than or equal to x.

The complexity of the ACS precomputation can be represented as the number of two-input adders required for the ACS precomputation. For the proposed M-step K-nested LLA architecture, the number of two-input adders ($C_{proposed}$) is $$C_{proposed} = C_{proposed\_add} + C_{proposed\_CS\_r2} + \quad\quad\text{EQ. 14}$$
$$C_{proposed\_CS\_rx} \cdot (2^{K-1}-1)$$

where the number of two input adders ($C_{proposed\_add}$), radix-2 CS units ($C_{proposed\_CS\_r2}$), and radix-$2^{K-1}$ CS units ($C_{proposed\_CS\_rx}$) for the ACS precomputation are calculated as $$C_{proposed\_add} = 2^{K-1}\left[\frac{M}{K}\sum_{i=2}^{K} 2^i + (2^{K-1})^2\left(\frac{M}{K}-1\right)\right], \quad\text{EQ. 14.a}$$

$$C_{proposed\_CS\_r2} = (2^{K-1})^2\left(\frac{M}{K}\right), \quad\text{EQ. 14.b}$$

$$C_{proposed\_CS\_rx} = (2^{K-1})^2\left(\frac{M}{K}-1\right) \quad\text{EQ. 14.c}$$

For the traditional M-step look-ahead architectures with pipeline structure, the number of two-input adders ($C_{conv}$) required for the ACS precomputation is $$C_{conv} = C_{conv\_add} + C_{conv\_CS\_r2} \quad\quad\text{EQ. 15}$$
$$= 2^{K-1}\left[\sum_{i=2}^{K-1} 2^i + 3 \cdot 2^{K-1}(M-K+1)\right]$$

where the number of two input adders ($C_{conv\_add}$) and radix-2 CS units ($C_{conv\_CS\_r2}$) are $$C_{conv\_add} = 2^{K-1}\left[\sum_{i=2}^{K-1} 2^i + 2^K(M-K+1)\right], \quad\text{EQ. 15.a}$$

$$C_{conv\_CS\_r2} = (2^{K-i})^2(M-K+1) \quad\text{EQ. 15.b}$$

The decoding latency and the complexity of the ACS precomputation for M-step look-ahead architecture are summarized in Table II. As can be seen in Table II, even if the look-ahead step (M) is not a power-of-two multiple of the encoder constraint length (K), low-latency Viterbi decoders can be implemented efficiently. For example, if K=7, a 49-parallel design has equivalent latency but fewer functional units than a 56-parallel ($2^3$-multiple of K) design.

CONCLUSION

Various embodiments of the present invention have been described above. These various embodiments can be implemented, for example, in optical fiber, twisted-pair, coaxial cable, and wireless communication receivers. These various embodiments can also be implemented in systems other than communications systems. It should be understood that these

TABLE II

LATENCY AND COMPLEXITY OF ACS PRECOMPUTATION

K = 3

| M | LATENCY Proposed | traditional | COMPLEXITY proposed: 176.(M/3)-112 | traditional: 48.M-80 |
|---|---|---|---|---|
| 3 (K) | 3 <100.00%> | 3 | 64 <100.00%> | 64 |
| 6 (2K) | 6 <66.67%> | 9 | 240 <115.38%> | 208 |
| 9 (3K) | 9 <60.00%> | 15 | 416 <118.18%> | 352 |
| 12 ($2^2$K = 4K) | 9 <42.86%> | 21 | 592 <119.35%> | 496 |
| 15 (5K) | 12 <44.44%> | 27 | 768 <120.00%> | 640 |
| 18 (6K) | 12 <36.36%> | 33 | 944 <120.41%> | 784 |
| 21 (7K) | 12 <30.77%> | 39 | 1120 <120.69%> | 928 |
| 24 ($2^3$K = 8K) | 12 <26.67%> | 45 | 1296 <120.90%> | 1072 |
| 48 ($2^4$K = 16K) | 15 <16.13%> | 93 | 2704 <121.58%> | 2224 |

K = 4

| M | LATENCY Proposed | traditional | COMPLEXITY proposed: 1248.(M/4)-960 | conventional: 192.M-480 |
|---|---|---|---|---|
| 4 (K) | 4 <100.00%> | 4 | 288 <100.00%> | 288 |
| 8 (2K) | 8 <66.67%> | 12 | 1536 <145.45%> | 1056 |
| 16 ($2^2$K = 4K) | 12 <42.86%> | 28 | 4032 <155.56%> | 2592 |
| 32 ($2^3$K = 8K) | 16 <26.67%> | 60 | 9024 <159.32%> | 5664 |
| 48 (12K) | 20 <21.74%> | 92 | 14016 <160.44%> | 8736 |

K = 5

| M | LATENCY Proposed | traditional | COMPLEXITY proposed: 9152.(M/5)-7936 | conventional: 768.M-2624 |
|---|---|---|---|---|
| 5 (K) | 5 <100.00%> | 5 | 1216 <100.00%> | 1216 |
| 10 (2K) | 10 <66.67%> | 15 | 10368 <205.06%> | 5056 |
| 20 ($2^2$K = 4K) | 15 <42.86%> | 35 | 28672 <225.13%> | 12736 |
| 40 ($2^3$K = 8K) | 20 <26.67%> | 75 | 65280 <232.35%> | 28096 |
| 50 (10K) | 25 <26.32%> | 95 | 83584 <233.63%> | 35776 |

K = 7

| M | LATENCY Proposed | conventional | COMPLEXITY proposed: 1326848.(M/7)-1306624 | conventional: 12288.M-65792 |
|---|---|---|---|---|
| 7 (K) | 7 <100.00%> | 7 | 20224 <100.00%> | 20224 |
| 14 (2K) | 14 <66.67%> | 21 | 1347072 <1267.95%> | 106240 |
| 28 ($2^2$K = 4K) | 21 <42.86%> | 49 | 4000768 <1437.72%> | 278272 |
| 35 (5K) | 28 <44.44%> | 63 | 5327616 <1462.47%> | 364288 |
| 42 (6K) | 28 <36.36%> | 77 | 6654464 <1477.77%> | 450304 |
| 49 (7K) | 28 <30.77%> | 91 | 7981312 <1488.16%> | 536320 |
| 56 ($2^3$K = 8K) | 28 <26.67%> | 105 | 9308160 <1495.68%> | 622336 | embodiments have been presented by way of example only, and not limitation. It will be understood by those skilled in the relevant art that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A method for implementing a M-parallel Viterbi decoder by combining M trellis steps of a trellis, generated by a convolutional code encoder containing (K-1) memory elements, as a pipeline structure, comprising:
   (i) a M-step look-ahead add-compare-select precomputation unit;
   (ii) an add-compare-select recursion unit,
   (iii) a survivor path management circuit, and
   (iv) flip-flops or registers for inter-stage pipelining, wherein M and K are integers:
   wherein the M-step look-ahead add-compare-select precomputation unit is obtained by:
   (a) forming an initial add-compare-select circuit which combines the branch metrics of the first K inputs, and replicating this $\lceil M/K \rceil$ times for processing of all M parallel inputs, where $\lceil x \rceil$ denotes the largest integer greater than or equal to x,
   (b) forming a layered intermediate add-compare-select circuit, where inputs of each add-compare-select unit are coupled to outputs of the previous layer, and each of its outputs is coupled to an input of the add-compare-select unit of the next layer
   and wherein:
   the inputs of the add-compare-select recursion unit are coupled to the outputs generated by the final layer of the intermediate circuit and the outputs generated by the said add-compare-select recursion unit in the past clock cycle,
   and wherein:
   the survivor path management circuit is implemented as a pipeline structure, obtained by:
   (c) forming a layered survivor path circuit, corresponding to the layered intermediate add-compare-select circuit, where each input of this circuit is coupled to a parallel path select output generated by the add-compare-select units of the previous layer and is controlled by a parallel path select output generated by the add-compare-select units of the current layer, and each of its outputs is coupled to the inputs of the survivor path circuit of the next layer, and wherein the first layer inputs are the parallel path select outputs generated by the initial add-compare-select circuit,
   (d) a final survivor path circuit associated with the add-compare-select recursion unit, wherein its inputs are coupled to the parallel path select signals of the last layer of the layered survivor path circuit and the control signals are coupled to the path select signals generated by the add-compare-select recursion unit.

2. The method of claim 1, wherein an initial add-compare-select unit combines K trellis steps into one trellis step and selects the maximum likely trellis path out of the two possible parallel paths.

3. The method of claim 1, wherein an intermediate add-compare-select unit combines two branch metrics generated by the initial add-compare-select circuits and selects the maximum likely trellis path out of the $2^{K-1}$ possible parallel trellis paths.

4. The method of claim 1, wherein the function of each unit of the layered survivor path circuit is to generate a parallel path select output to represent selecting one out of $2^{K-1}$ possible pairs of parallel paths using $2^{K-1}$-to-1 multiplexers, and rearrange and concatenate them.

5. The method of claim 1, wherein the add-compare-select units in the initial and intermediate add-compare-select circuits contain adders, and maximum-select or minimum-select circuits.

6. A digital circuit for implementing a M-parallel Viterbi decoder by combining M trellis steps of a trellis, generated by a convolutional code encoder containing (K-1) memory elements, as a pipeline structure, comprising:
   (i) a M-step look-ahead add-compare-select precomputation unit,
   (ii) an add-compare-select recursion unit,
   (iii) a survivor path management circuit, and
   (iv) flip-flops or registers for inter-stage pipelining, wherein M and K are integers:
   wherein the M-step look-ahead add-compare-select precomputation unit is obtained by:
   (a) forming an initial add-compare-select circuit which combines the branch metrics of the first K inputs, and replicating this $\lceil M/K \rceil$ times for processing of all M parallel inputs, where $\lceil x \rceil$ denotes the largest integer greater than or equal to x,
   (b) forming a layered intermediate add-compare-select circuit, where inputs of each add-compare-select unit are coupled to the outputs of the previous layer, and each of its outputs is coupled to an input of the add-compare-select unit of the next layer
   and wherein:
   the inputs of the add-compare-select recursion unit are coupled to the outputs generated by the final layer of the intermediate circuit and the outputs generated by the said add-compare-select recursion unit in the past clock cycle,
   and wherein:
   the survivor path management circuit is implemented as a pipeline structure, obtained by:
   (c) forming a $\log_2(M/K)$ layered survivor path circuit, corresponding to the layered intermediate add-compare-select circuit, where each input of this circuit is coupled to a parallel path select output generated by the add-compare-select units of the previous layer and is controlled by a parallel path select output generated by the add-compare-select units of the current layer and each of its outputs is coupled to the inputs of the survivor path circuit of the next layer, and wherein the first layer inputs are the parallel path select outputs generated by the initial add-compare-select circuit,
   (d) a final survivor path circuit associated with the add-compare-select recursion unit, wherein its inputs are coupled to the parallel path select signals of the last layer of the layered survivor path circuit and the control signals are coupled to the path select signals generated by the add-compare-select recursion unit.

7. The digital circuit of claim 6, wherein an initial add-compare-select unit combines K trellis steps into one trellis step and selects the maximum likely trellis path out of the two possible parallel paths.

8. The digital circuit of claim 6, wherein an intermediate add-compare-select unit combines two branch metrics generated by the initial add-compare-select circuits and selects the maximum likely trellis path out of the $2^{K-1}$ possible parallel trellis paths.

9. The digital circuit of claim 6, wherein the function of each unit of the layered survivor path circuit is to generate a parallel path select output to represent selecting one out of $2^{K-1}$ possible pairs of parallel paths using $2^{K-1}$-to-1 multiplexers, and rearrange and concatenate them.

10. The digital circuit of claim 6, wherein the add-compare-select units in the initial and intermediate add-compare-select circuits contain adders and maximum-select or minimum-select circuits.

11. The digital circuit of claim 6 used in a communications transceiver.

12. The digital circuit of claim 6 used in a serializer-deserializer (serdes) system.

13. The digital circuit of claim 6 used in a fiber optic transmission system.

14. The digital circuit of claim 6 used in a wireless transceiver.

15. The digital circuit of claim 6 used in a copper transceiver.

16. The digital circuit of claim 6 used in a coaxial cable transceiver.

17. The digital circuit of claim 6 used in a high-density optical recording system.

18. The digital circuit of claim 6 used in a high-density magnetic recording system.

* * * * *